United States Patent [19]

Schunke et al.

[11] Patent Number: 5,821,573

[45] Date of Patent: Oct. 13, 1998

[54] FIELD EFFECT TRANSISTOR HAVING AN ARCHED GATE AND MANUFACTURING METHOD THEREOF

[75] Inventors: J. Neil Schunke; David Zaterka; Thomas S. Taylor, all of Durham, N.C.

[73] Assignee: Mitsubishi Semiconductor America, Inc., Durham, N.C.

[21] Appl. No.: 733,312

[22] Filed: Oct. 17, 1996

[51] Int. Cl.⁶ ................................................. H01L 29/78
[52] U.S. Cl. ............................................................ 257/296
[58] Field of Search ...................................... 257/296, 623

[56] References Cited

U.S. PATENT DOCUMENTS

| 4,324,038 | 4/1982 | Chang et al. | 29/571 |
| 4,590,504 | 5/1986 | Guterman | 257/316 |
| 4,740,827 | 4/1988 | Niitsu et al. | 257/369 |
| 4,910,566 | 3/1990 | Ema | 257/296 |
| 4,952,993 | 8/1990 | Okumura | 257/344 |
| 5,021,847 | 6/1991 | Eitan et al. | 257/316 |
| 5,093,273 | 3/1992 | Okumura | 437/40 |
| 5,177,027 | 1/1993 | Lowrey et al. | 437/41 |
| 5,247,197 | 9/1993 | Ema | 257/296 |

FOREIGN PATENT DOCUMENTS

| 2-110973 | 4/1990 | Japan | 257/336 |
| 6-061487 | 3/1994 | Japan | 257/336 |

*Primary Examiner*—Tom Thomas
*Assistant Examiner*—David B. Hardy
*Attorney, Agent, or Firm*—Lowe, Price, LeBlanc & Becker

[57] ABSTRACT

An arched gate MOSFET having first and second source/drain regions formed spaced apart on a main surface of the semiconductor substrate, and a gate electrode formed on said main surface of the semiconductor substrate through an insulating film. The gate electrode extends in a first direction between the first and second source/drain regions defining a channel length, and in a second direction, perpendicular to the first direction, defining a channel width. The surface of the semiconductor substrate is arcuate in shape in the channel width direction and the gate electrode conforms to the arcuate shape of the surface of the semiconductor substrate.

5 Claims, 10 Drawing Sheets

FIELD EFFECT TRANSISTOR HAVING AN ARCHED GATE AND MANUFACTURING METHOD THEREOF

TECHNICAL FIELD

The invention relates generally to a semiconductor integrated circuit device, and, more particularly, to a semiconductor integrated circuit device having a novel metal oxide semiconductor field effect transistor (MOSFET) with an arched gate structure. The invention further relates to a manufacturing method of a MOSFET having an arched gate structure.

BACKGROUND ART

An FET is a basic component of almost every semiconductor integrated circuit device. One of type of semiconductor integrated circuit device having a plurality of MOSFETs is a so-called DRAM (Dynamic Random Access Memory) capable of inputting/outputting stored information at random. The DRAM comprises a plurality of memory cells arranged in a plurality of rows and columns with each memo cell comprised of a transistor and capacitor connected thereto. FIG. 1 is a plan view of part of a conventional DRAM. In FIG. 1, future contact holes for bit lines (not shown) to be connected to source/drain regions are labeled 5. FIG. 2 is a sectional view of the conventional DRAM of FIG. 1 taken along line 2—2 and FIG. 3 is a sectional view of the conventional DRAM of FIG. 1 taken along line 3—3, showing a so-called planar (standard) gate arrangement for a MOSFET. Referring to FIG. 2, an isolation field oxide 20 is selectively formed on a P-type silicon substrate 22 defining a plurality of element forming regions 40, a capacitor dielectric 54 is selectively formed on the isolation field oxide 20 and the silicon substrate 22, and a capacitor electrode 56 is selectively formed on the capacitor dielectric 54. An isolation/gate dielectric 24 is selectively formed over the capacitor electrode 56, the isolation field oxide 20, and the silicon substrate 22. The isolation/gate dielectric 24 acts as a gate dielectric over the silicon substrate 22 and depending on the process, may or may not be formed at the same time as the portion of the isolation/gate dielectric formed over the capacitor electrode 56. A transistor gate electrode 26 is formed on the isolation/gate dielectric 24. The distance A between opposing ends of the isolation field oxide 20 in each element forming region, defines a certain channel width of the transistor, and the distance $X_1$, from the end of the isolation field oxide 20 in one element forming region to a corresponding end of the isolation field oxide 20 in an adjacent element, defines a pitch of the transistor. $A/X_1$ defines a ratio of the transistor channel width to the pitch.

A manufacturing method of the section of the conventional DRAM shown in FIG. 2, with a MOSFET having a planar gate structure will be described with reference FIGS. 4 through 11.

Referring to FIG. 4, an oxide film 28, formed of a silicon oxide film and having a thickness of 50–1000 Å, is grown on the surface of a P-type silicon substrate 22 using thermal oxidation. Subsequently, a silicon nitride ($Si_3N_4$) film 32 is formed on the oxide film 28 and a photoresist film 34 is formed and subsequently patterned on the silicon nitride film 32. The silicon nitride 32 is selectively etched as shown in FIG. 5, exposing portions of the oxide film 28. Thereafter, boron ions of about $1\times10^{12}$ to $1\times10^{14}/cm^2$ dose are implanted through the exposed oxide film 28 and into the silicon substrate 22 and then the photoresist film 34 is removed as shown in FIG. 6. Subsequently, the isolation field oxide 20, e.g. $SiO_2$, as shown in FIG. 7, is formed by local oxidation of silicon (LOCOS) using the silicon nitride film 32 as a oxidation resistant mask. The final thickness of the isolation field oxide 20 is determined based on design rules and the LOCOS continues until the thickness of the isolation field oxide 20 is generally equal to the required final thickness plus the thickness of the oxide film 28.

Next, the silicon nitride film 32 and the oxide film 28 are removed by etching as shown in FIGS. 8 and 9, respectively. Then, as shown in FIG. 10, patterned mask 19 is formed and n type impurity ions are implanted into the substrate and diffused to form a first conductive layer 23 for the capacitor. Referring to FIG. 11, the patterned mask 19 is removed, and capacitor dielectric 54 and capacitor electrode 56 are selectively formed on isolation field oxide 20 and the silicon substrate.

Referring to FIG. 2, an isolation/gate dielectric 24 is formed to a film thickness of about 50 Å–250 Å over the capacitor electrode 56, the isolation field oxide 20, and the silicon substrate 22 using a thermal oxidation method, and subsequently, the polycrystalline silicon layer 26 is deposited to a film thickness of 1000 Å–5000 Å by CVD. Then the polycrystalline silicon layer 26 is patterned using conventional photolithography techniques to form the gate electrode 26 as shown in FIGS. 2 and 3. Finally, the n type impurity ions are again implanted into the substrate using the patterned gate electrode as a mask and diffused to form source/drain regions 25 shown in FIG. 3.

In order to increase integration density of the MOSFETs in a semiconductor integrated circuit device, the resolution of the photolithographic equipment has been increased. That is, increased integration density of a semiconductor integrated circuit device generally has been achieved by reducing device dimensions using photolithographic techniques. However, increases in resolution for photolithographic equipment typically require some time to be developed. As a result, increases in integration density which are dependent on increases in photolithography resolution have been delayed. Thus, there is a need to provide increased integration density in semiconductor integrated circuit devices which is not dependent upon increased resolution of photolithographic equipment, but is also compatible with increases in resolution as they occur.

There is also a need to increase integration density in semiconductor integrated circuit devices in a way which does not to require additional manufacturing steps or new equipment which increase the cost of the devices.

SUMMARY OF THE INVENTION

It is a feature and advantage of the invention to provide a MOSFET having a finer pitch for a given channel width than can be achieved by planar gate technology.

It is another feature and advantage of this invention to provide a process of manufacturing a MOSFET having a finer pitch than can be achieved by planar gate MOSFET technology when using the same photolithographic equipment.

According to the present invention, the foregoing features and advantages are attained by a semiconductor integrated circuit device comprising a semiconductor substrate having a main surface and an isolation field oxide selectively formed on the main surface of the semiconductor substrate defining at least one element forming region with at least one FET formed in the element forming region. The FET includes a gate electrode formed on the main surface of the semiconductor substrate through an insulating film. The gate electrode extends in a first direction defining a channel length, and a second direction, perpendicular to the first direction, defining a channel width. The main surface of the semiconductor substrate in at least one element forming region is arcuate in cross-section in at least the channel width direction and a shape of the gate electrode in the channel width direction conforms to the shape of the main surface of the semiconductor substrate in the channel width direction.

In accordance with one aspect of the invention the semiconductor device has a plurality of element forming regions.

In accordance with another aspect of the invention the semiconductor device is a random access memory having a plurality of memory cells formed in a matrix of rows and columns, and each memory cell includes at least one of MOSFET.

In accordance with still another aspect of the invention, the random access memory has a capacitor formed in each element forming region. The capacitor includes first and second conductive layers with a dielectric therebetween with the first conductive layer coupled to one of the first and second source/drain regions. The second conductive layer extends over and conforms to the shape of at least a portion of the main surface of the semiconductor substrate in the channel width direction and an insulation layer is formed on the second conductive layer.

In accordance with yet another aspect of the invention, a process of manufacturing an arched gate MOSFET on a main surface of a semiconductor substrate, comprises sequentially forming on the main surface of the semiconductor substrate an oxide film having a predetermined thickness, a nitride film, and a photoresist film, respectively. Then, portions of the photoresist are selectively removed using a first etching process, and the nitride film is removed in areas where the photoresist film has been removed using a second etching process to expose portions of the oxide film. Thereafter, boron ions are implanted through the exposed oxide film into the substrate and then the remaining portions of the photoresist are removed. Subsequently, the exposed portions of the oxide film are thermally oxidized, selectively forming an isolation field oxide on the main surface of a semiconductor substrate. The thermal oxidation continues until the isolation field oxide has a thickness approximately about two to six times the thickness of the planned final thickness of the isolation field oxide. The layer of silicon nitride is removed and the oxide is etched back to the planned final thickness, leaving the exposed main surface of the semiconductor substrate arcuate in the areas between the isolation field oxide. Each exposed area of the main surface defines an element forming region and a width of each element forming region along the main surface of the semiconductor substrate delineates a predetermined channel width. Next, a patterned mask is formed, and impurity ions are implanted and diffused in the substrate to form a first conductive layer for the capacitor. The patterned mask is then removed, and an insulating film and conductive layer are formed and patterned on the main surface of the semiconductor substrate to form the second conductive layer of the capacitor. Then, an isolation/gate dielectric and another conductive layer are formed and selectively etched to form a gate electrode. Finally, the impurity ions are again implanted in the main surface of the semiconductor substrate using the gate electrode as a mask to form source/drain regions.

Still other features and advantages of the present invention will become readily apparent to those skilled in this art from the following detailed description, where only the preferred embodiment of the invention is shown and described, simply by way of illustration of the best mode contemplated of carrying out the invention. As will be realized, the invention is capable of other and different embodiments in various obvious respects, all without departing from the invention. Accordingly, the drawings and description are to be regarded as illustrative in nature, and not as restrictive.

BEST MODE FOR PRACTICING THE INVENTION

In order to achieve higher integration density in DRAMs than can otherwise be achieved by a given piece of photolithographic equipment, the inventors provide a MOSFET with an arched gate structure which reduces pitch for a given transistor channel width. The arched gate structure is realized by modification of any localized oxidation of silicon process. The present invention is described with respect to a standard LOCOS process for forming isolation field oxides. However, the same arched gate structure can be achieved using any other LOCOS process for forming isolation field oxides such as a Poly Buffered LOCOS process.

Figure 12:
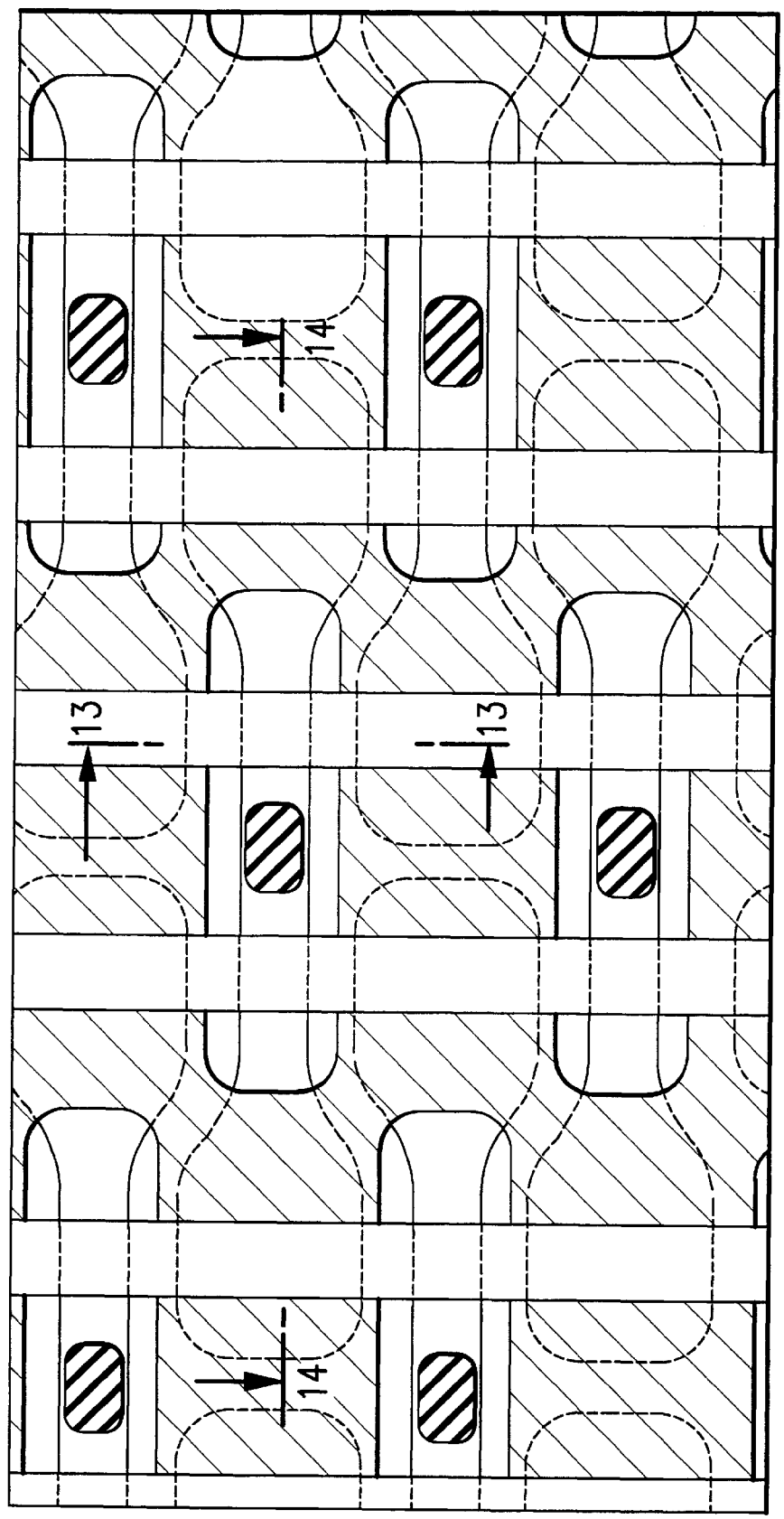
FIG. 12 is a plan view of a DRAM of the present invention, having a plurality of MOSFETs.
Figure 13:
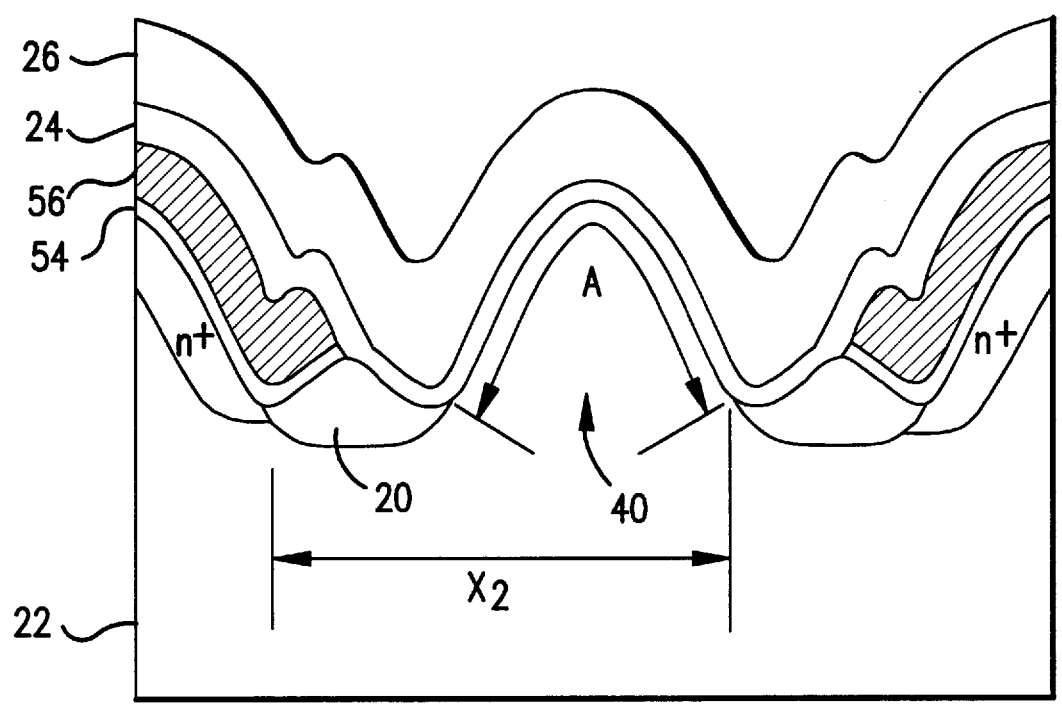
FIG. 13 is a schematic sectional view of the DRAM of FIG. 12 taken along line 13—13.
Figure 14:
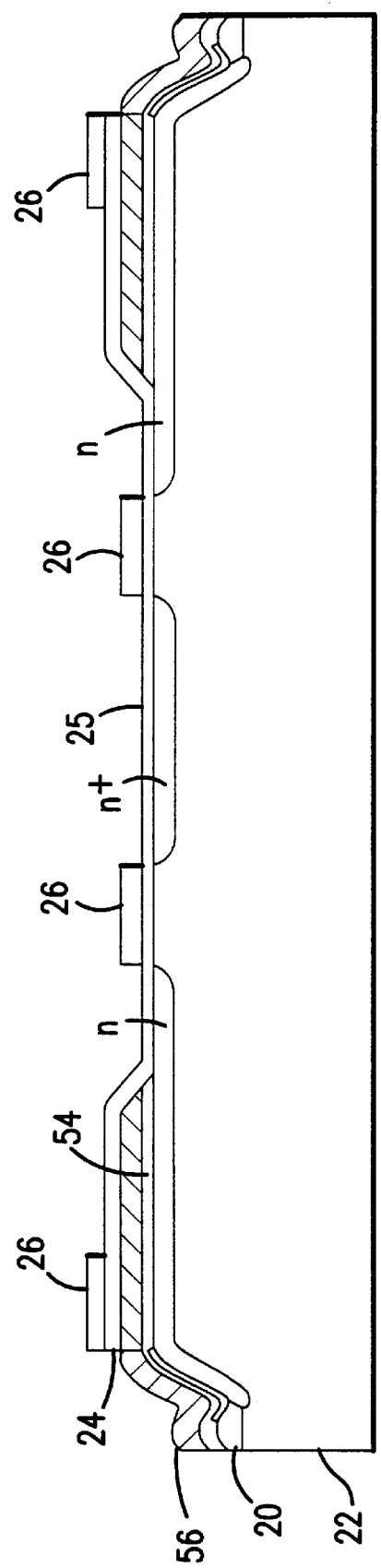
FIG. 14 is a schematic sectional view of the DRAM of FIG. 12 taken along line 14—14.

FIG. 12 is a plan view of part of a DRAM having a plurality of MOSFETs with an arched gate structure of the present invention, arranged in a matrix of columns and rows. FIG. 13 is a sectional view of the DRAM of FIG. 12 taken along line 13—13 and FIG. 14 is a sectional view of the conventional DRAM of FIG. 12 taken along line 14—14., showing the arched gate structure for a MOSFET.

Referring to FIG. 13, isolation field oxide 20 is selectively formed on the silicon substrate 22, defining a plurality of element forming regions 40, a capacitor dielectric 54 is selectively formed on the isolation field oxide 20 and the silicon substrate 22, and a capacitor electrode 56 is selectively formed on the capacitor dielectric 54. An isolation/gate dielectric 24 is selectively formed over the capacitor electrode 56, the isolation field oxide 20, and the silicon substrate 22. The isolation/gate dielectric 24 acts as a gate dielectric over the silicon substrate 22 and, depending on the process, may or may not be formed at the same time as the portion of the isolation/gate dielectric formed over the capacitor electrode 56. A transistor gate electrode 26 is formed on the gate dielectric 24.

Figure 1:
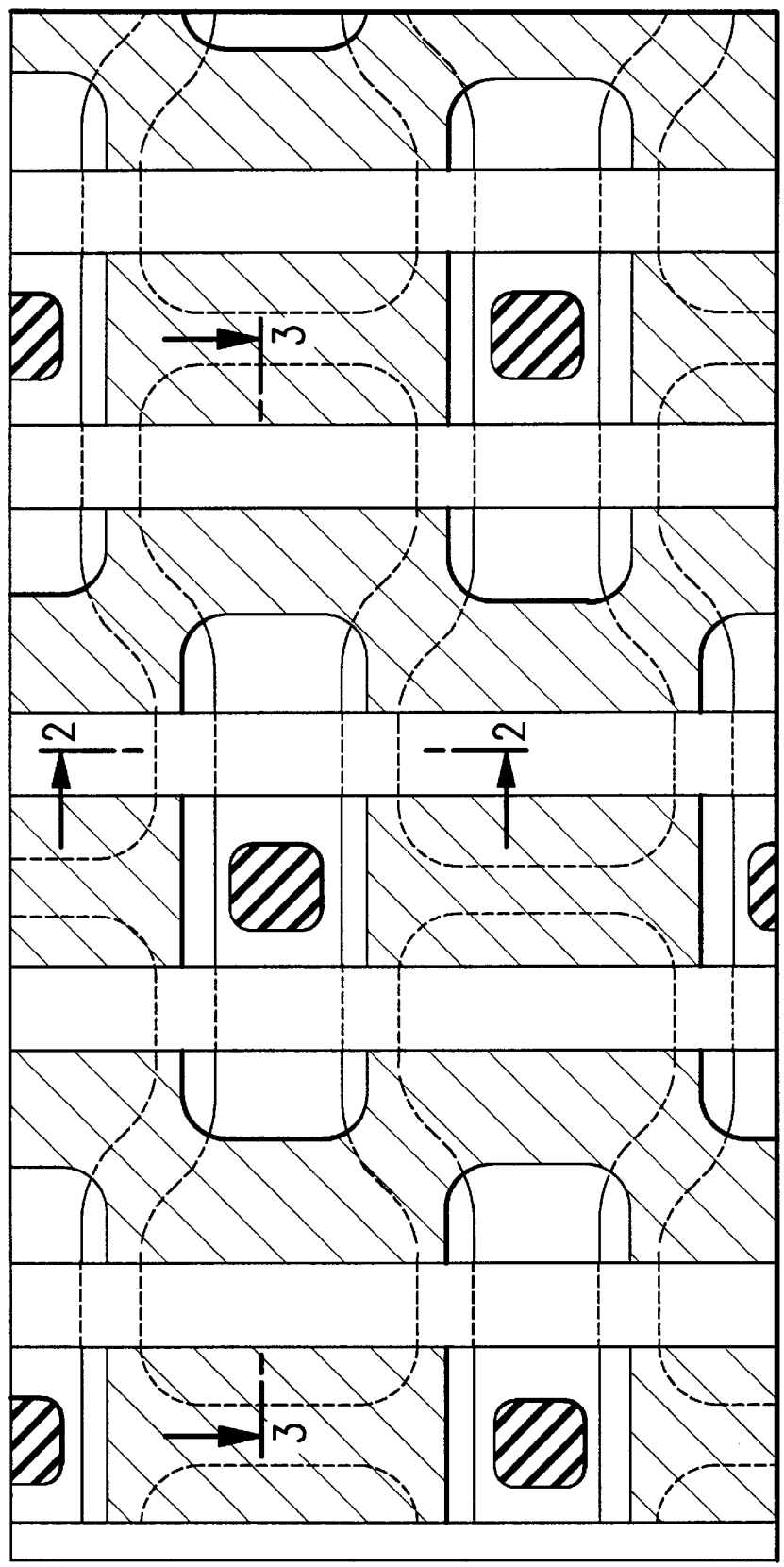
FIG. 1 is a plan view of a conventional DRAM having a plurality of MOSFETs.
Figure 2:
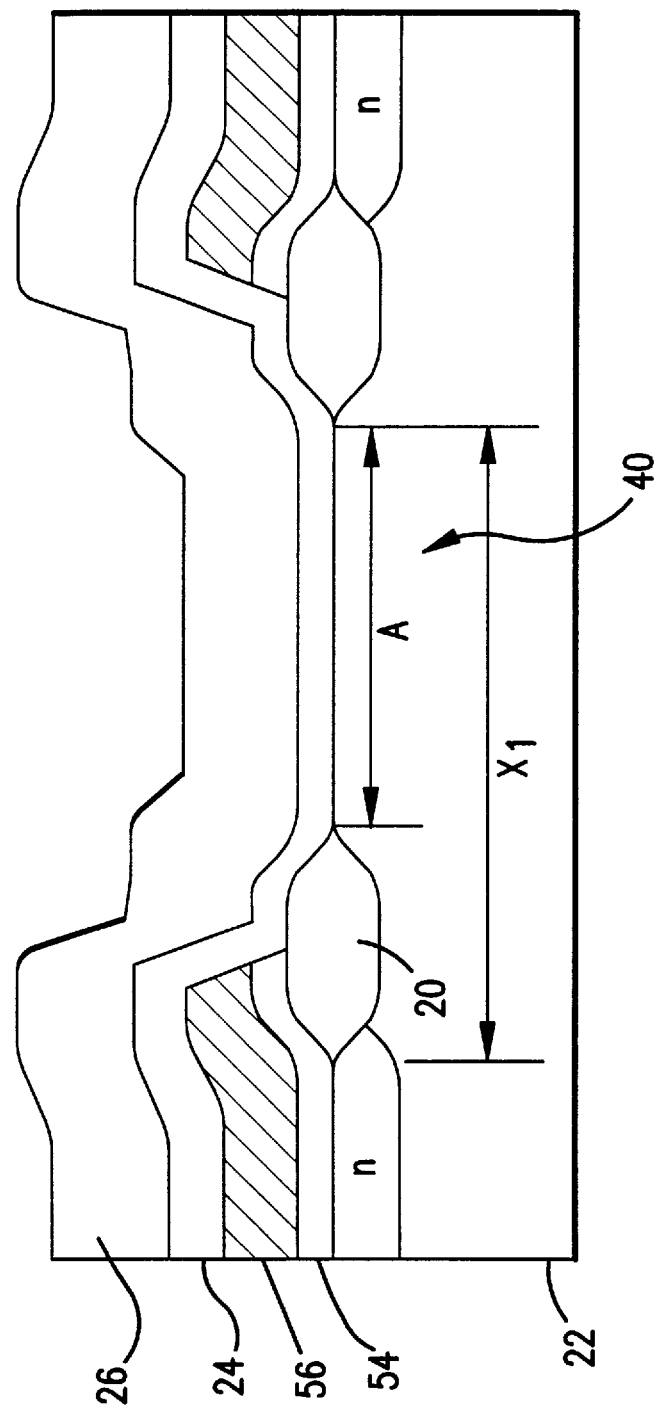
FIG. 2 is a schematic sectional view of the conventional DRAM of FIG. 1 taken along line 2—2.
Figure 3:
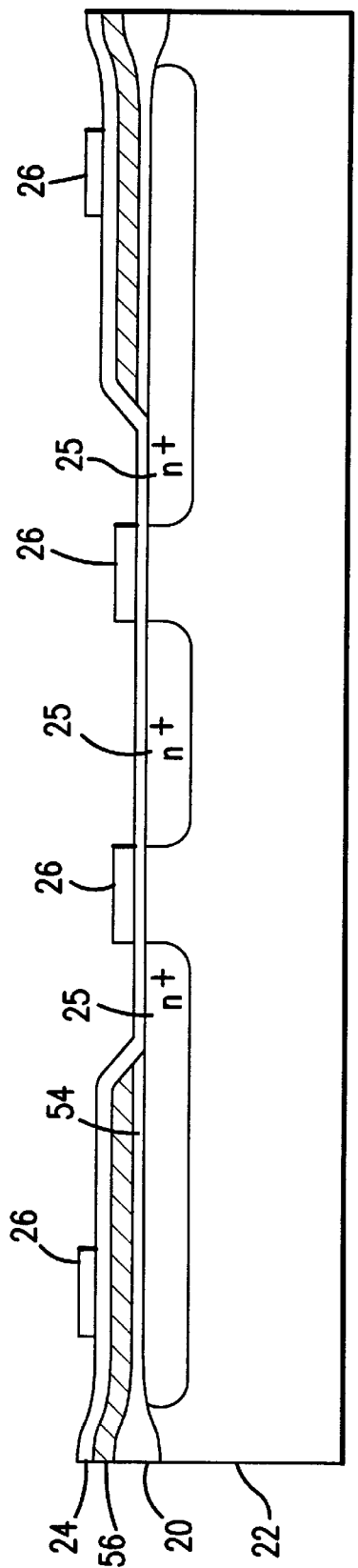
FIG. 3 is a schematic sectional view of the conventional DRAM of FIG. 1 taken along line 3—3.

The arrangement shown in FIG. 13 differs from the arrangement shown in FIG. 2 in that the shape of the surface of the silicon substrate, between the selectively formed isolation field oxide 20, is arcuate (arched) rather than planar, and the isolation/gate dielectric 24 and the transistor gate electrode 26 conform to the arcuate shape of the surface of the silicon substrate. As shown also in FIG. 13, the capacitor electrode 56 is formed to conform also to the arcuate shape of the surface of the silicon substrate, increasing the surface area of the capacitor.

As shown in FIG. 13, for a certain channel width A, the arcuate shape of the main surface of the silicon substrate results in a pitch $X_2$ (distance from one end of one isolation field oxide to a corresponding end of the adjacent isolation field oxide) which is less than the pitch $X_1$ of the conventional semiconductor integrated circuit device having a planar gate structure shown in FIG. 2. Thus, the channel width to pitch ratio $A/X_2$ of the arched gate transistor is greater than the channel width to pitch ratio $A/X_1$ of the planar gate transistor. As a greater channel width to pitch ratio permits greater integration density of MOSFETs in an integrated circuit device, increased integration density is achieved with the MOSFET having the arched gate structure shown in FIG. 13 as compared with the MOSFET having the planar gate structure shown in FIG. 2.

Figure 4:
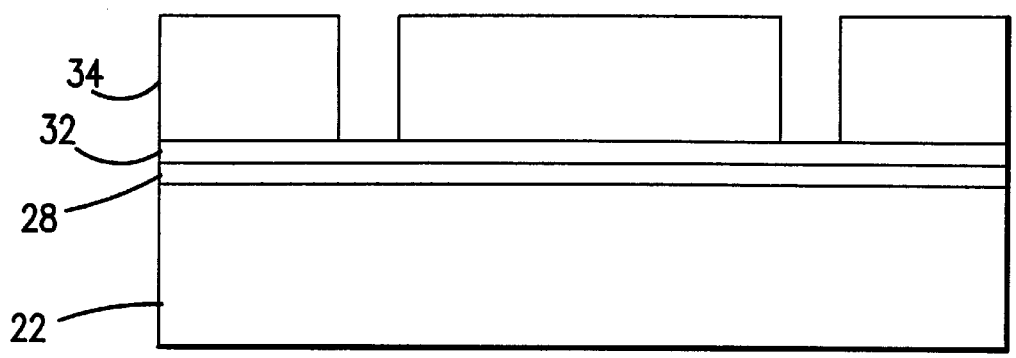
FIGS. 4–11 are schematic sectional views showing main successive processes of manufacturing the section of the conventional DRAM of FIG. 2.
Figure 5:
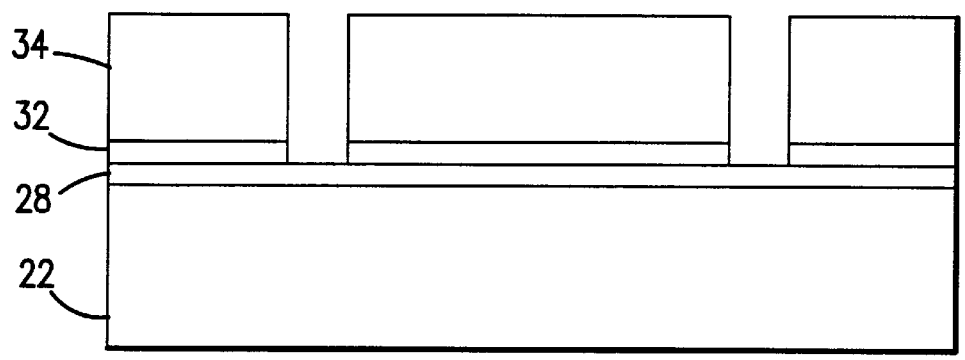
Figure 6:
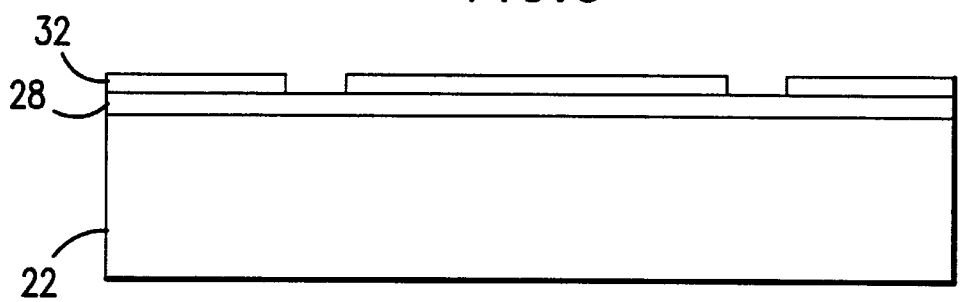
Figure 7:
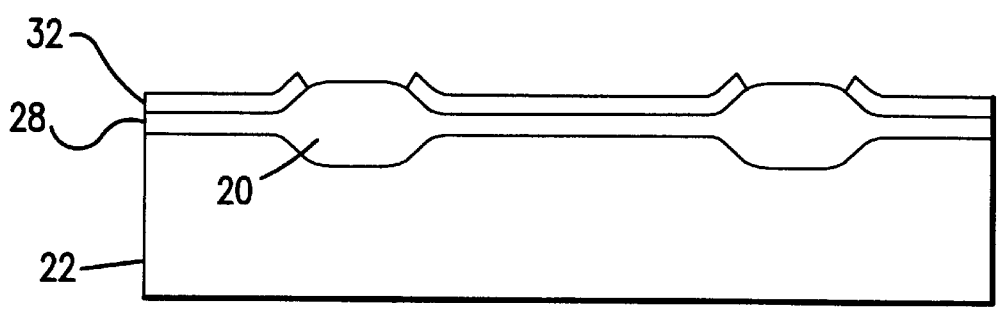
Figure 15:
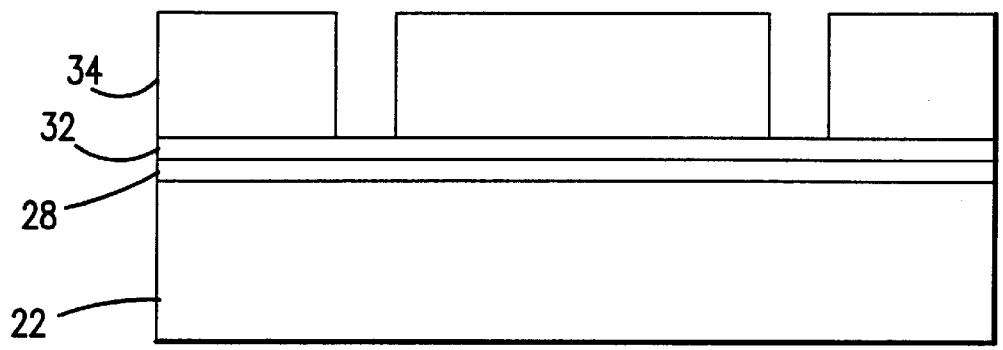
FIGS. 15–20 are schematic sectional views showing main successive processes of manufacturing the section of the DRAM of FIG. 13.
Figure 16:
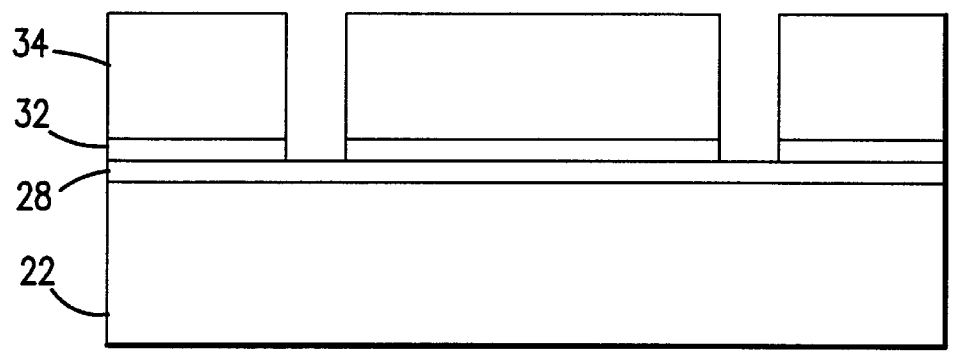
Figure 17:
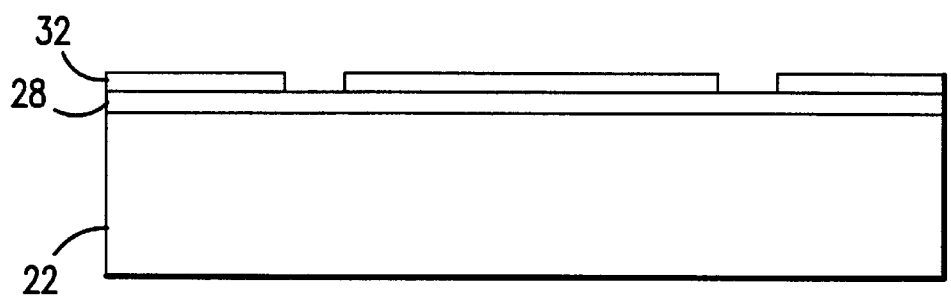

A manufacturing method of the section of the DRAM shown in FIG. 13 will now be described with reference to FIGS. 15–20. The steps of the manufacturing method shown in FIGS. 15–17 are substantially identical to the steps of the manufacturing method shown in FIGS. 4–6 for the conventional planar gate structure and their description will not be repeated. However, the positions at which the silicon nitride film 32 and photoresist film 34 are patterned differ from that of the planar gate structure. More specifically, the patterned positions are moved closer together in the direction which defines the channel width to account for the increased distance which results from the arcuate shape. That is, if the same patterned positions as for the planar gate structure were used for the arched gate structure, the distance A shown in FIG. 2, along the arched surface of the substrate would be greater than in the planar gate structure. Since the channel width distance A is a design constant for the transistor whether it is a planar structure or an arched gate structure, it is necessary to adjust the patterned positions so that the channel width of the arched gate structure will be the distance A.

In the conventional LOCOS process, the isolation field oxides are formed by thermal oxidation of a boron injected silicon oxide formed on the main surface of the silicon substrate using the silicon nitride film as a oxidation resistant mask. In one example of thermal oxidation, the silicon substrate is heated to a temperature of about 950° C. for about one hour. It is known that end portions of the isolation field oxide 20 form under the edge of the silicon nitride film 32, as a result of oxidation, in a lateral direction. These end portions are commonly known as "bird's beaks" (areas 21 in FIG. 8) and their size is dependent on thickness and width of the nitride film and oxide film.

Figure 18:
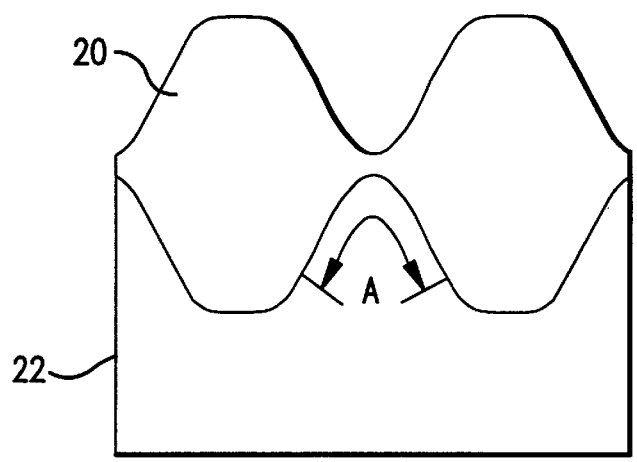

Normally, bird's beaks are considered a problem as their lateral extension tend to reduce an effective area of a region of the surface of the silicon substrate in which elements are formed (element forming region). The present invention recognizes that when the bird's beaks are etched back, the surface area of the substrate increases as compared to the original planar condition of the substrate. By forming oversized isolation field oxides and then etching back to provide the desired size (determined by design rules) of the isolation field oxide 20, the distance $X_2$ (pitch), shown in FIG. 13, from the end of the isolation field oxide 20 in one element forming region to a corresponding end of the isolation field oxide 20 in the adjacent element forming region, decreases as compared with the planar gate structure shown in FIG. 2. As reduced pitch permits greater integration density, the LOCOS process is modified to increase the bird's beaks portions of the isolation field oxide 20, as shown in FIG. 18. More specifically, as the final thickness of the isolation field oxide is determined based on design rules, LOCOS is extended in time until the isolation field oxide is approximately two to six times the thickness of the planned final thickness of the isolation field oxide 20.

Figure 8:
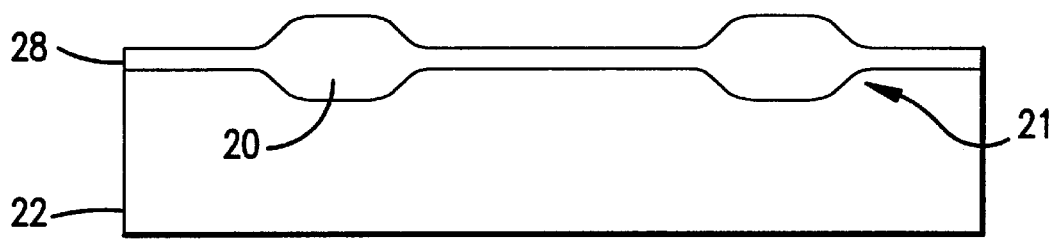
Figure 9:
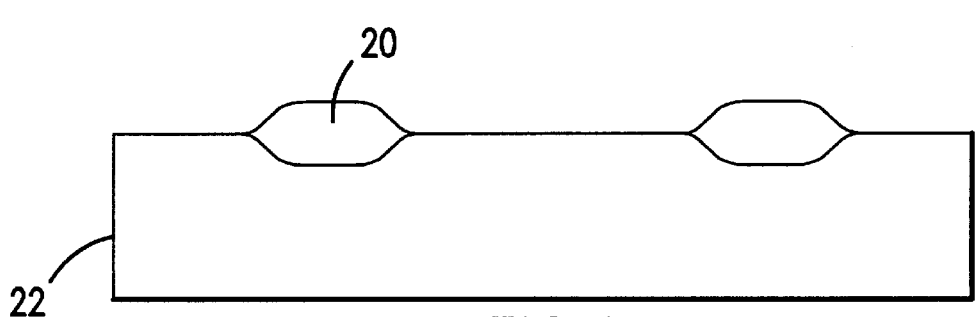
Figure 10:
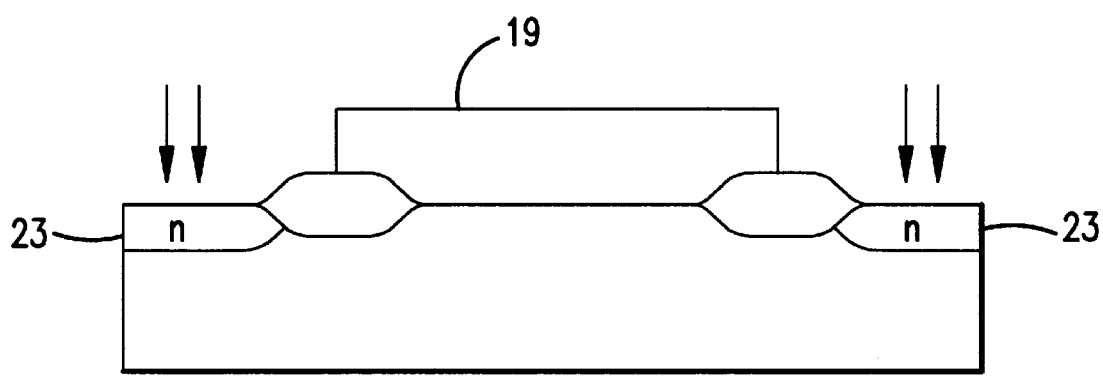
Figure 11:
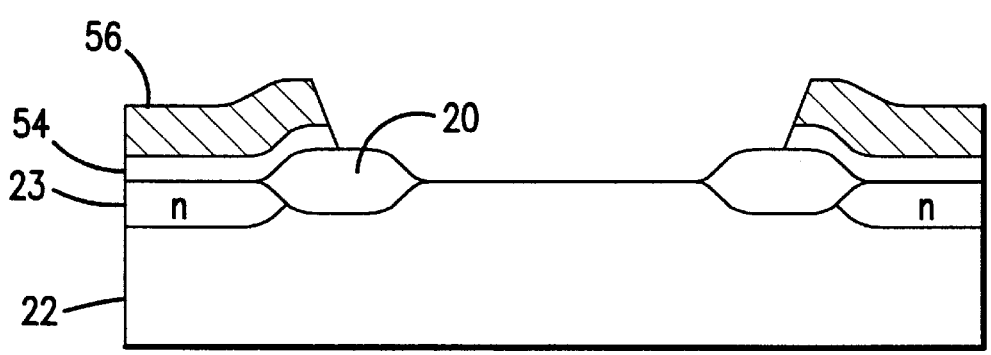

The extension of LOCOS causes the surface of the silicon substrate 22 to become arcuate (arched) along the portion of the substrate surface which defines the distance A, of the future channel width, between opposing ends of the isolation field oxide 20 in each element forming region as shown in FIG. 18 in comparison to the relatively planar surface of FIG. 8.

Figure 19:
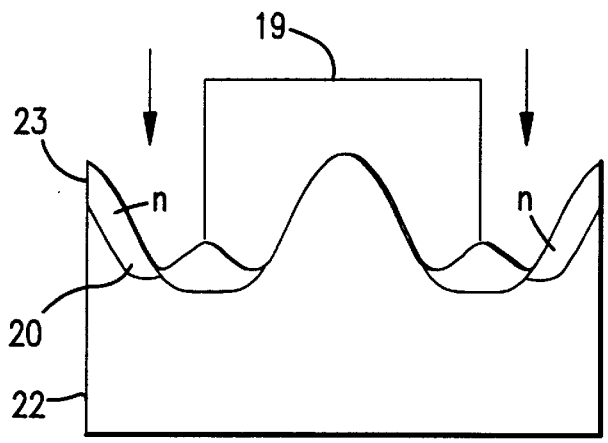

Referring to FIG. 19, to take advantage of the reduced pitch, the period of etching to remove the oxide film 28 is increased relative to that in the conventional process to remove silicon oxide also in the area of the bird's beaks. The etching continues until the length A which defines the channel width along the silicon substrate is exposed. The entire exposed area of the silicon substrate defines an effective area for the element forming region.

Figure 20:
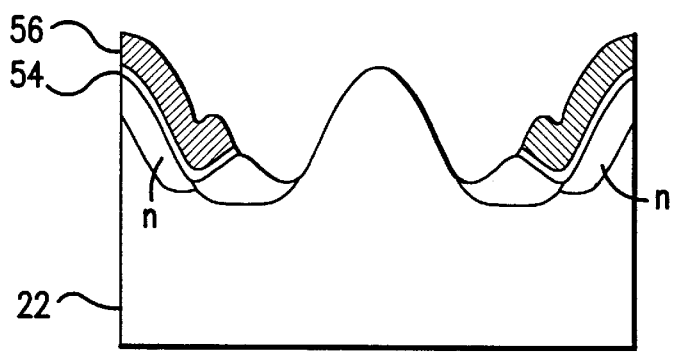

The remaining steps shown in FIGS. 19, 20 and 13 are the same as steps 10, 11 and 2 of the conventional DRAM with a MOSFET having a planar gate structure, as shown in FIG. 2. That is, patterned mask 19 is formed and n type impurity ions are implanted into the substrate and diffused to form a first conductive layer 23 for the capacitor as shown in FIG. 19. Referring to FIG. 20, the patterned mask 19 is removed, and capacitor dielectric 54 and capacitor electrode 56 are selectively formed on isolation field oxide 20 and the silicon substrate. Then, the isolation/gate dielectric 24 is formed to a film thickness of about 50 Å–250 Å over the capacitor electrode 56, the isolation field oxide 20, and the silicon substrate 22 using a thermal oxidation method, and subsequently, the polycrystalline silicon layer 26 is deposited to a film thickness of 1000 Å–5000 Å by CVD. The polycrystalline silicon layer 26 is then patterned using conventional photolithography techniques to form the gate electrode 26 as shown in FIGS. 13 and 14. Finally, the n type impurity ions are again implanted into the substrate using the patterned gate electrode as a mask and diffused to form source/drain regions 25 shown in FIG. 14. If necessary, a silicon dioxide protection film (not shown) can be formed and patterned prior to the ion implantation.

There accordingly has been described a semiconductor integrated circuit device having a smaller pitch for a given channel width than can be achieved by available photolithographic equipment. In particular, an MOSFET having an arched gate structure is formed without increasing the manufacturing steps as compared with the manufacturing steps for forming an MOSFET having a planar gate structure.

While the present disclosure shows the boundary of the element forming region as having a particular shape, other shapes of the boundary of the element forming region are possible and the same effects are achieved as in the case of the shape of the boundary shown in the present disclosure.

The many features and advantages of the invention are apparent from the detailed specification, and thus, it is intended by the appended claims to cover all such features and advantages of the invention which fall within the true spirit and scope of the invention. Since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A semiconductor integrated circuit device comprising:

a semiconductor substrate having a main surface;

an isolation field oxide selectively formed on the main surface of said semiconductor substrate surrounding and isolating an element forming region; and a field effect transistor (FET) formed in said element forming region, said FET including a gate electrode formed on said main surface of the semiconductor substrate through an insulating film, said gate electrode extending along said main surface of the semiconductor substrate in a first direction defining a channel length and in a second direction, perpendicular to the first direction, defining a channel width, said main surface of said semiconductor substrate in said element forming region having a generally convex arcuate shape cross section in the channel width direction and a shape of said gate electrode in said channel width direction conforming to the shape of said main surface of the semiconductor substrate in the channel width direction.

2. The semiconductor integrated circuit device of claim 1, further comprising a capacitor formed in at least a portion of said element forming region, said capacitor including a conductive layer with a portion conforming to the shape of the main surface of said semiconductor substrate in the channel width direction.

3. A semiconductor integrated circuit device comprising:

a semiconductor substrate having a main surface;

an isolation field oxide selectively formed on the main surface of said semiconductor substrate surrounding and isolating each of a plurality of element forming regions; and at least one field effect transistor (FET) formed in each element forming region, said at least one FET including first and second source/drain regions formed spaced apart on the main surface of the semiconductor substrate, and a gate electrode formed on said main surface of the semiconductor substrate through an insulating film, said gate electrode extending along said main surface of the semiconductor substrate in a first direction between said first and second source/drain regions defining a channel length and in a second direction, perpendicular to the first direction, defining a channel width, said main surface of said semiconductor substrate in said element forming region having a generally convex arcuate shape cross section in the channel width direction and a shape of said gate electrode in said channel width direction conforming to the shape of said main surface of the semiconductor substrate in the channel width direction.

4. The semiconductor integrated circuit device of claim 3, wherein said semiconductor device is a random access memory having a plurality of memory cells and each memory cell includes at least one of said plurality of FETs.

5. The semiconductor integrated circuit device of claim 3, further comprising a capacitor formed in at least a portion of said each element forming region, said capacitor including a conductive layer with a portion of said conductive layer conforming to the shape of the main surface of said semiconductor substrate in the channel width direction.

* * * * *